United States Patent [19]

Lampe et al.

[11] Patent Number: 4,722,073
[45] Date of Patent: Jan. 26, 1988

[54] MAGNETORESISTIVE RANDOM ACCESS CROSS-TIE MEMORY ARCHITECTURE AND SIGNAL PROCESSING SYSTEM

[75] Inventors: Donald R. Lampe, Ellicott City, Md.; Mark A. Mentzer, Lititz, Pa.; Eric H. Naviasky, Baltimore, Md.

[73] Assignee: Westinghouse Electric Corp., Pittsburgh, Pa.

[21] Appl. No.: 795,284

[22] Filed: Nov. 5, 1985

[51] Int. Cl.$^4$ ............................................. G11C 19/08
[52] U.S. Cl. ........................................ 365/87; 365/158
[58] Field of Search ................................. 365/87, 158

[56] References Cited

U.S. PATENT DOCUMENTS

| Re. 30,087 | 8/1979 | White et al. | 324/30 B |
|---|---|---|---|
| 3,997,885 | 12/1976 | Battarel | 365/87 |
| 4,035,629 | 7/1977 | Lampe et al. | 235/193 |
| 4,473,893 | 9/1984 | Zierhut et al. | 365/87 |

OTHER PUBLICATIONS

Publication by L. J. Schwee, entitled "Proposal in Cross-Tie Wall and Block Line Propagation in Thin Magnetic Films", IEEE Transactions on Magnetics, IMAG 8, No. 3, pp. 405–407, Sep., 1972.

Primary Examiner—James W. Moffitt
Attorney, Agent, or Firm—W. G. Sutcliff

[57] ABSTRACT

A magnetoresistive random access memory array and signal processing system which provides an improved signal to noise ratio. The basic memory complex associated with the storage of a single binary digit is a quad of memory elements or cells which are addressed in complementary fashion. The enhanced read-out signal discrimination is had by utilizing a double-correlated double-sampling differential signal processing system in which complementary data is serially passed through the same path with repeated high-speed differencing which greatly reduces nonuniformity fixed patterns as well as correlated low frequency temporal noise.

4 Claims, 10 Drawing Figures

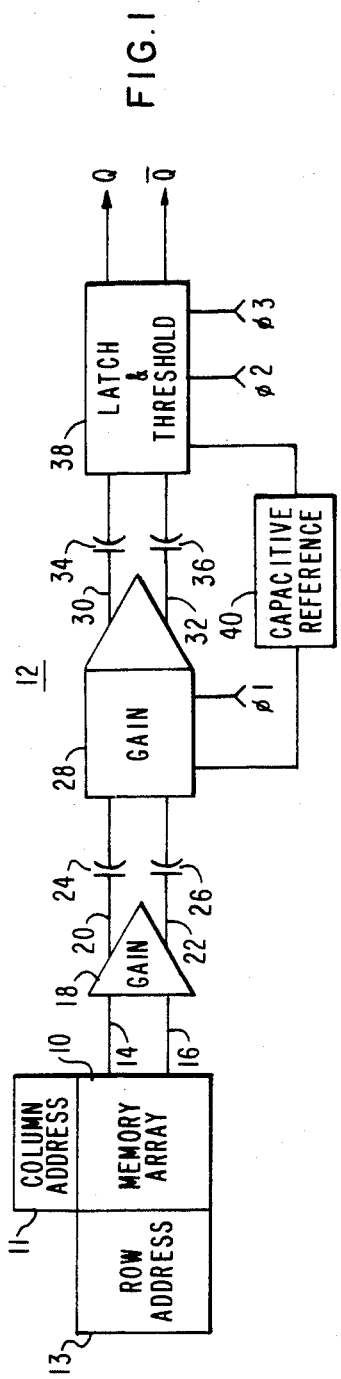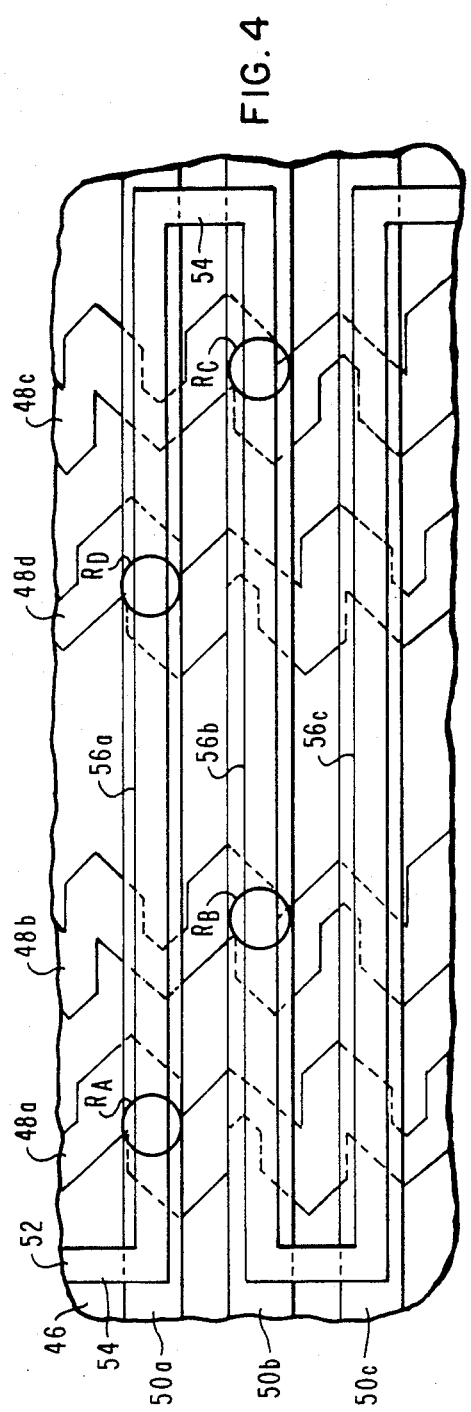

MAGNETORESISTIVE RANDOM ACCESS CROSS-TIE MEMORY ARCHITECTURE AND SIGNAL PROCESSING SYSTEM

BACKGROUND OF THE INVENTION

1. Field of the Invention:

The present invention relates to the field of magnetic memory systems for the storage of binary digital data, and in particular to a random access memory device which utilizes stable ferromagnetic domain states for binary data storage.

2. Description of the Prior Art:

A serial access memory system utilizing stable ferromagnetic domain states for binary data storage was proposed by L. J. Schwee in the publication "Proposal on Cross-tie Wall and Bloch-line Propagation in Thin Magnetic Films" IEEE Transactions on Magnetics, IMAG 8, No. 3, pages 405 through 407, September 1972. In such a memory system, a thin film of ferromagnetic material of approximately 81% nickel and 19% iron is initially magnetized and thereafter stable domain states which constitute two stable digital storage states can be established by the appropriate application of magnetic fields to create in one case a stable Neel wall state, and a second state in which a Cross-Tie Block line domain wall is created. The digital data can be written into the memory by application of an appropriate magnetic field and the digital data can be read out using a magneto-resistive effect.

U.S. Pat. No. 3,868,660 teaches the significance of the shaping of the thin film of Permalloy magnetic material with spaced serrated edges being provided for the strips of film of magnetic material. U.S. Pat. No. 4,473,893 teaches a cross-tie random access memory system with an X-Y array of discrete memory elements formed of serrated Permalloy film and having aligned rows of addressing conductors superposed over the discrete memory elements in the X row, and serpentine-shaped Y column conductors aligned over and intersecting with the X row conductors over the individual memory elements of the X-Y memory array. In this prior art cross-tie memory, the digital data is written onto the memory elements using half address signals applied to both the row and column conductors. This system also includes a row of reference memory elements which are utilized during the read-out operation with a differential read-out being had between the memory elements with the stored digital data and the reference memory elements.

The cross-tie random access memory technology offers the following desirable characteristics: non-volatility, non-destructive read-out, radiation hardness, high density, and a large temperature operating range. The read-out of digital data from such cross-tie random access memories utilizes the magneto-resistive effect in which upon application of a magnetic field to the memory element, a change in resistance to current flowing through the magnetic element is produced. This change in resistance is a function of whether the memory element is in a stable Neel wall only state or a cross-tie Block line domain state, which are the two stable binary data states. The small magneto-resistance modulation produced during memory read-out of such devices gives rise to small signals which competes with both fixed pattern non-uniformities and substantial temporal noise.

U.S. Pat. No. Re. 30,087, owned by the assignee of the present invention, teaches a coherent sampled CMOS read-out circuit and signal processor coupled to a CCD shift register operated by a two-phase minority carrier transfer clock system. The signal processing taught by this prior art patent has also been termed correlated double sampling which enhances the signal to noise ratio of the output signal on the CCD devices. In U.S. Pat. No. 4,035,629, owned by the assignee of the present invention, an extended correlated double sampling signal processing technique is utilized for processing output signals from charge transfer devices in which the signal and a reference level sample are differenced in at least two stages to thereby correct the resultant output signal by reducing both temporal and spatial noise.

SUMMARY OF THE INVENTION

A magnetoresistive random access memory array architecture and signal processing system are taught in which a thin magnetoresistive film which exhibits, bistable domain states forms an X-Y memory element array. In reading the stored binary digit a magnetoresistive response indicative of the stored binary digit is differentially processed to significantly enhance the signal to noise ratio of the output signal.

In the preferred embodiment the thin film of magnetoresistive material is disposed as a plurality of spaced apart columns upon a semiconductive substrate, with the film shaped and patterned to provide the X-Y array of spaced apart memory elements which are magnetically addressable to one of two possible stable binary data states. A simple binary digit is stored in a quad of memory elements which are addressed in double complementary fashion.

A plurality of row conductors are aligned or superimposed over row aligned pairs of memory cells. A plurality of serpentine-shaped column conductors having columnar extending portions interconnecting row aligned extending portions which are arranged so that adjacent row extending portions conduct current in opposed directions atop row adjacent memory elements. Digital signal writing means are connectable to the row and column conductors whereby a single binary digit can be stored in complementary fashion in a quad of adjacent memory cells. A potential source is connectable to the thin film columns when the stored binary data is to be read out of memory. A digital sequential read signal means is connectable to the row conductors which, when actuated by such read signal produces a magneto-resistive response in the memory element which response is indicative of the respective stable state written into the memory element. The system includes memory array read-out signal processor means for differentially processing the magneto-resistive response induced voltage increment from the complementary memory cells.

BRIEF DESCRIPTION OF THE DRAWINGS

FIG. 1 is a schematic block diagram of the cross-tie random access memory array system and signal processing system of the present invention.

FIG. 4 is a greatly enlarged partial planar view of a portion of the cross-tie random access memory of the present invention.

DESCRIPTION OF THE PREFERRED EMBODIMENTS

Figure 2:
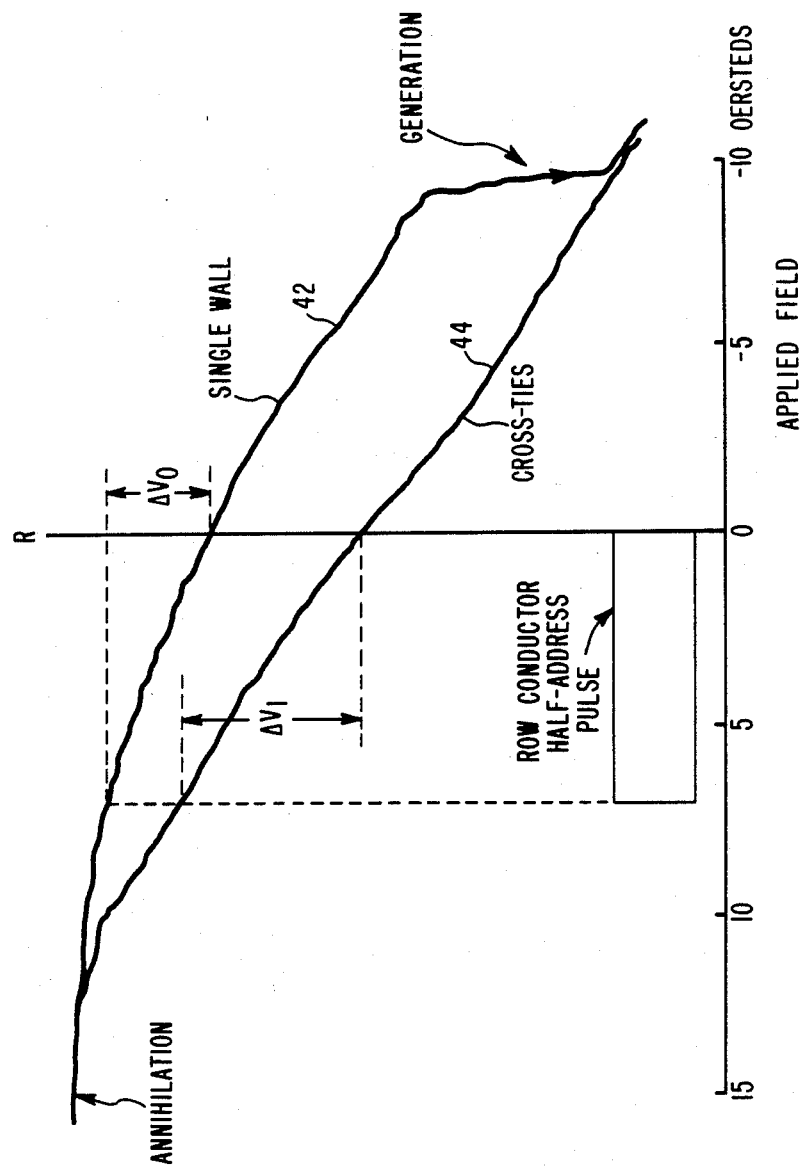
FIG. 2 is a plot of resistance versus magnetic field for a cross-tie memory element illustrating the magnetoresistive for the Neel wall state and the cross-tie wall state.

The magnetoresistive random access memory array architecture and signal processing system are best illustrated by reference to the embodiment in FIG. 1 in which the memory array 10 is coupled to the signal processing system 12 which is a full differential double-correlated double-sampling system. Column address means 11, and row address means 13 are coupled to the memory array 10. A write and read control means 12 controls the writing and reading of data via the row address 13 and column address 11 as described more fully later. The memory array 10 is coupled over differential output lines 14 and 16 to a first gain amplifier 18, the differential outputs of which are coupled over lines 20 and 22 to equal valued capacitors 24 and 26 respectively, and thereafter coupled to a second gain amplifier 28. The differential output of the second gain amplifier 28 is coupled along lines 30 and 32 to a second matched pair of capacitors 34 and 36 which are in turn coupled to latch and threshold means 38 from which output values Q and $\bar{Q}$ which represent respectively the digital levels and the logic inverse of the digital levels corresponding to the data stored in the memory array. A capacitive reference means 40 is coupled to the second gain amplifier 28 and to the latch and threshold means 38. A $\phi1$ switch and pulse means is coupled to the second gain amplifier 28 as will be explained later in more detail, and a $\phi2$ and $\phi3$ switch and pulse means are likewise coupled to the latch and threshold means 38 as will be explained hereafter.

FIG. 2 illustrates the basic magneto-resistive effect relating the resistance change in a thin film Permalloy memory element as a function of the magnetic field which is applied when a half address voltage pulse or current pulse is applied on the row conductor over the magnetic memory element. In FIG. 2, the top curve 42 illustrates the change in resistance as a function of applied field for a single Neel wall domain state with the resultant $\Delta V_0$ being the change observed in the absence of a cross-tie. The lower curve 44 illustrates this characteristic for a memory element containing a cross-tie wherein the change $\Delta V_1$ is seen to be larger than the $\Delta V_0$ observed for the memory element in the absence of a cross-tie. Curves 42 and 44 form an RH (resistance-magnetic field) loop which is symmetric, but other magnetoresistive materials can be utilized which exhibit an asymmetric RH loop.

The structure of a preferred cross-tie memory array 10 can perhaps be best understood by reference to FIG. 4 wherein insulating substrate 46 has disposed thereon a plurality of spaced columns of thin film magnetized Permalloy material 48a, 48b, 48c, 48d. The edges of the thin columns of Permalloy material are serrated as is known in the art, and an X-Y array pattern of memory elements such as $R_A$, $R_B$, $R_C$, $R_D$ as in FIG. 4 are established on the surface of the substrate 46. The number of memory elements in the X-Y array can be widely varied depending upon the number of columns of Permalloy and the length of the columns. In the embodiment seen in FIG. 4, only four such memory elements are illustrated for purposes of understanding the basic preferred array pattern and function. Row conductors 50a, 50b and 50c are aligned over and superimposed over pairs of the memory elements, as for example, the row conductor 50a is aligned over memory element $R_A$ and $R_D$. A serpentine-shaped column conductor 52 as columnar extending portions 54 interconnecting row aligned extending portions 56a, 56b, 56c, with the row aligned extending portion 56a likewise passing over row adjacent memory elements $R_A$ and $R_D$. The serpentine shape of the column conductor provides that current flowing in the column conductor will be directed in opposed directions in adjacent row extending portions, thus the current flowing in the row aligned extending portion 56 above memory elements $R_A$ and $R_D$ will, for example, travel from left to right, while the current direction in the row aligned extending portion 56 above row 50b and memory elements $R_B$ and $R_C$ would be in the opposed direction. A pair of row conductors not seen in FIG. 4 would be coupled to the lower extending portions of the thin film Permalloy columns and these row conductors would serve as the differential outputs to lines 14 and 16 illustrated in FIG. 1.

Figure 5:
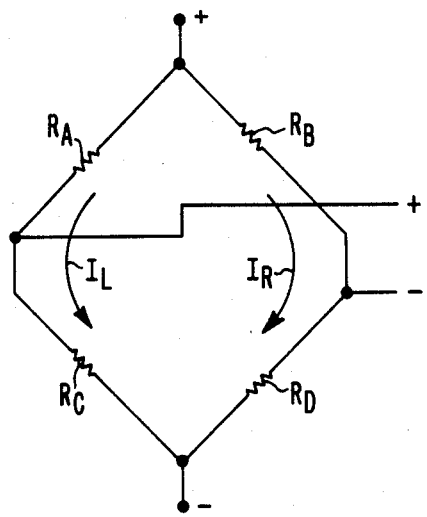
FIG. 5 illustrates a circuit schematic showing the bridge configuration connection of the double complementary memory elements used in the present invention to store a single binary digit.
Figure 6:
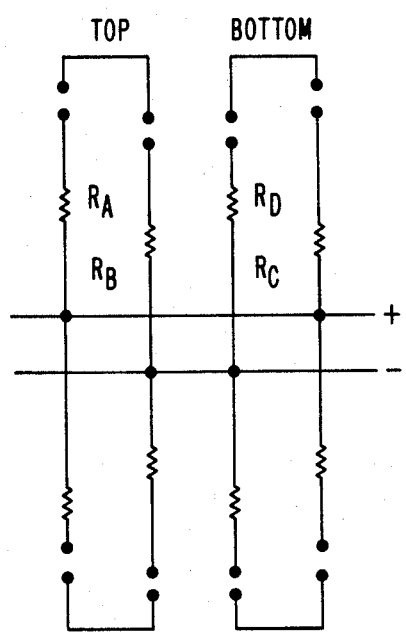
FIG. 6 is a rearranged circuit schematic as per FIG. 5 rearranged to represent the spacial position of the four memory elements which constitute the bridge resistors as they are spacially disposed in the embodiment of FIG. 4.

The basic memory element complex seen in FIG. 4 which provides for storage of a single binary digit is a quad of cross-tie elements $R_A$, $R_B$, $R_C$, $R_D$ which are arranged and addressed in double complementary fashion. The bridge circuits shown in FIGS. 5 and 6 help to illustrate in a classic bridge configuration the currents for a particular switching configuration as well as the center taps that are used directly in differential form as inputs to the differential amplifier 18. FIG. 6 is a rearranged bridge which represents the spatial position of the four bridge resistors or memory elements as they appear spatially on the device per FIG. 4. It can be appreciated how the particular memory element lay-out keeps all four memory element resistors in close proximity to ensure minimal spatial non-uniformities.

WRITING DATA

Figure 3A:
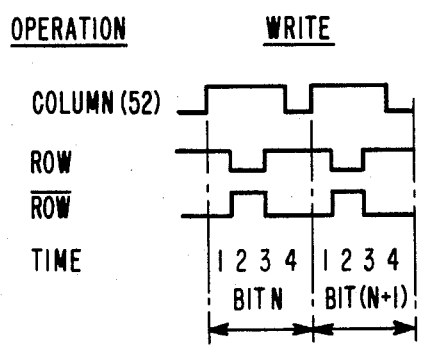
FIG. 3A is a plot of the writing signals applied to the memory array versus time for writing a digital binary state at a memory cell pair.

The writing of the double complementary distribution of domains into the four closely spaced memory elements or resistors can be easily understood by reference to the write operation signals illustrated in FIG. 3A and by reference to FIG. 4.

In writing data into the quad cell memory array as seen in FIG. 4, when the serpentine column 52 is selected and current flows from top to bottom through serpentine column 52, a half address current flows from left to right through row aligned portion 56a, and right to left through row aligned portion 56b. The row conductors 50a and 50b are addressed with complementary signals as seen in FIG. 3A with current in row 50a flowing from left to right and in 50b from right to left. The row conductor currents in 50a and 50b are also half address amplitude and combine with the currents in the serpentine portions 56a and 56b to create a magnetic field which is large enough to simultaneously write the quad of memory elements $R_A$, $R_B$, $R_C$, $R_D$ used to store a single bit. Thus, a single X-Y coincidence address permits simultaneous writing of all four memory elements or a bit quad written in the double complementary form, with $R_A$ and $R_D$ without a cross-tie and $R_B$ and $R_C$ with a cross-tie. Obviously reversing all the half address currents in the column and row conductors would give the opposite domain state. It should also be noted that at any other X-Y location memory element, the resultant magnetic field is only fractionally that which is needed to create or annihilate cross-tie domain walls so that no change of state occurs thereat.

READING DATA

Figure 3B:
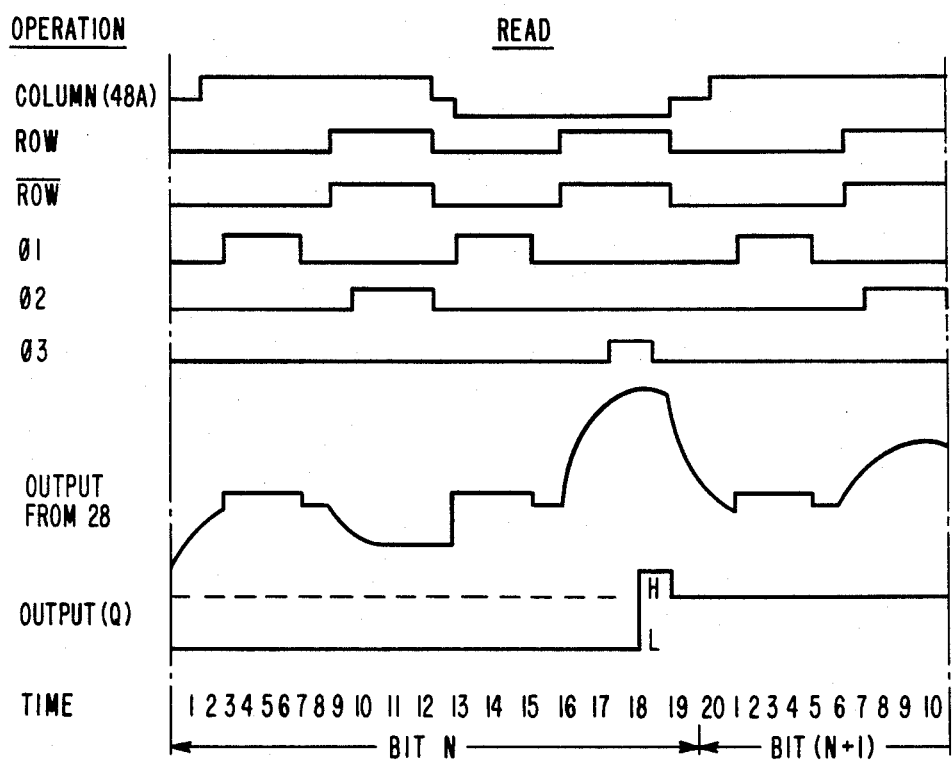
FIG. 3B is a plot of read signals versus time that will be reading and processing signals on the cross-tie random access memory of the present invention.

The read-out sequence from the memory array 10 in the signal processing system 12 can best be understood again by reference to FIGS. 1, 4 and 3B. The signal processing system 12 utilizes correlated double sampling to differentially remove most of the fixed pattern non-uniformity noise. The waveforms of FIG. 3B clearly define the read-out sequence. During the read operation, the column signal is applied to the respective Permalloy bridge column, and to the row conductor to define the memory element which is being read. The read signal applied to the row conductor is of an amplitude only about half the value needed for creation or annihilation of a cross-tie state, thus the row signal is not large enough to effect a change of domain state from a cross-tie state to a non-cross-tie state. During the read operation, a current is passed through the Permalloy column through the memory element which is selected and the selected row signal effects a small perturbation where a synchronizing field which effects the resistance of the current-carrying memory element with a relatively small resistance change being seen for a memory element which does not have a cross-tie wall and a somewhat larger change in resistance for a memory cell in which a cross-tie wall domain exists. As can be seen more clearly by reference to FIG. 2 wherein the smaller resistance change gives rise to a smaller $\Delta V_0$ while the larger resistance change gives rise to a larger $\Delta V_1$.

In response to the read address command to Permalloy columns, the selected read currents used to measure the associated magneto-resistive state are applied, while all the other columns are left disconnected and floating with column select switches in a high impedance state. The resultant read-out bias is clamped on the first series capacitors 24 and 26 after amplification in first gain amplifier 18. This read-out bias is clamped on the capacitors 24 and 26 by action of the $\phi 1$ switch and pulse means. At this point, the input offset error is exactly nulled by closure of the switch associated with $\phi 1$, impressing voltage on capacitor 24 and 26 exactly equal to but cancelling the input of said error. After the switch of $\phi 1$ is opened, the half address on row pair 50a, 50b is applied. When the signal from the second gain stage 28 has stopped slewing and attained equilibrium, $\phi 2$ switch impulse means is activated so as to store that signal on capacitor 34 and 36. At this point, the stored offset direction is directly subtracted from the first gain block output when it has settled from the magnetic perturbation. Activation of $\phi 2$ switch and pulse means acts to store on capacitors 34 and 36 a voltage equal and opposite to the output of the second gain means 28.

The read-out sequence continues by deactivating the half address current on the row pair 50a, 50b and reversing the read current in the Permalloy columns. Since the read currents have been reversed, the resultant offset applied to the pre-amp is likely to be changed. Thus, the new offset must be subtracted by repulsing $\phi 1$ switch and pulse means. At this point, the reversed current offset is again stored on the capacitors 24 and 26.

Next, the half address read current in row pair 50a, 50b is again activated producing a pulse out of the pre-amp. Since the previous peak value for row pair 50a, 50b had been clamped on capacitors 34 and 36 in a negative sens, the resultant voltage applied to the input of the comparator in the latch and threshold means 38 in the difference between the two peak values. But, because the Permalloy read current is reversed, essentially reversing the sensing drive on the bridge, the resultant magnetoresistive signal changes sign. The differencing action of double-correlated sampling had via the voltages clamped on capacitors 34 and 36 through the action of $\phi 2$ switch and pulse means, then doubles the signal amplitude while virtually eliminating any fixed pattern due to array or circuit offset non-uniformities and increases the temporal noise only by a small factor.

The correlated sampling not only cancels offset fixed patterns but because of the correlation of low frequency noise substantially reduces this adverse affect also. Note further that the read-out sequence is always the same. Thus, if a binary zero state had originally been stored at memory elements $R_A$, $R_B$, $R_C$, $R_D$, the resulting sequence appearing at the monitor test point would have the two halves interchanged. Hence, the positive excursion is clamped on capacitors 34 and 36 to be subtracted from the negative excursion at the later time when $\phi 3$ switch and pulse means is activated. The resultant difference is negative and very easy to discriminate from the positive difference given for a binary state 1. Consequently greatly enhanced discrimination derives from passing complementary data serially through the same path with repeated high-speed differencing. Furthermore, the preceding sequence for operating the quad memory element configuration effectively accumulates eight distinct magnetoresistive measurements constructively to discriminate between stored (1) or (0) states, giving an ultimate improvement in the signal to noise near 2.8 dB.

Finally, notice the clamp capacitors 24 and 26 as they are connected to the bases of the input differential matched pair of the second gain amplifier 28 as well as their respective reset switches. The time periods from the trailing edge of the first pulse of $\phi 1$ to the trailing edge of $\phi 2$ and secondly from the trailing edge of the second pulse of $\phi 1$ to the trailing edge of $\phi 3$ are the same. Thus, the mismatch between the leakage associated drift on the two capacitors 24 and 26 arising from any mismatch between the nominally identical reset switches and differential input pair should be very nearly the same for the two time periods. That is, even though the signal component is reversed in the two time periods, the drift error component is the same for both time periods, facilitating its cancellation by the simple serial subtraction of double-correlated, double-sampling.

Figure 7:
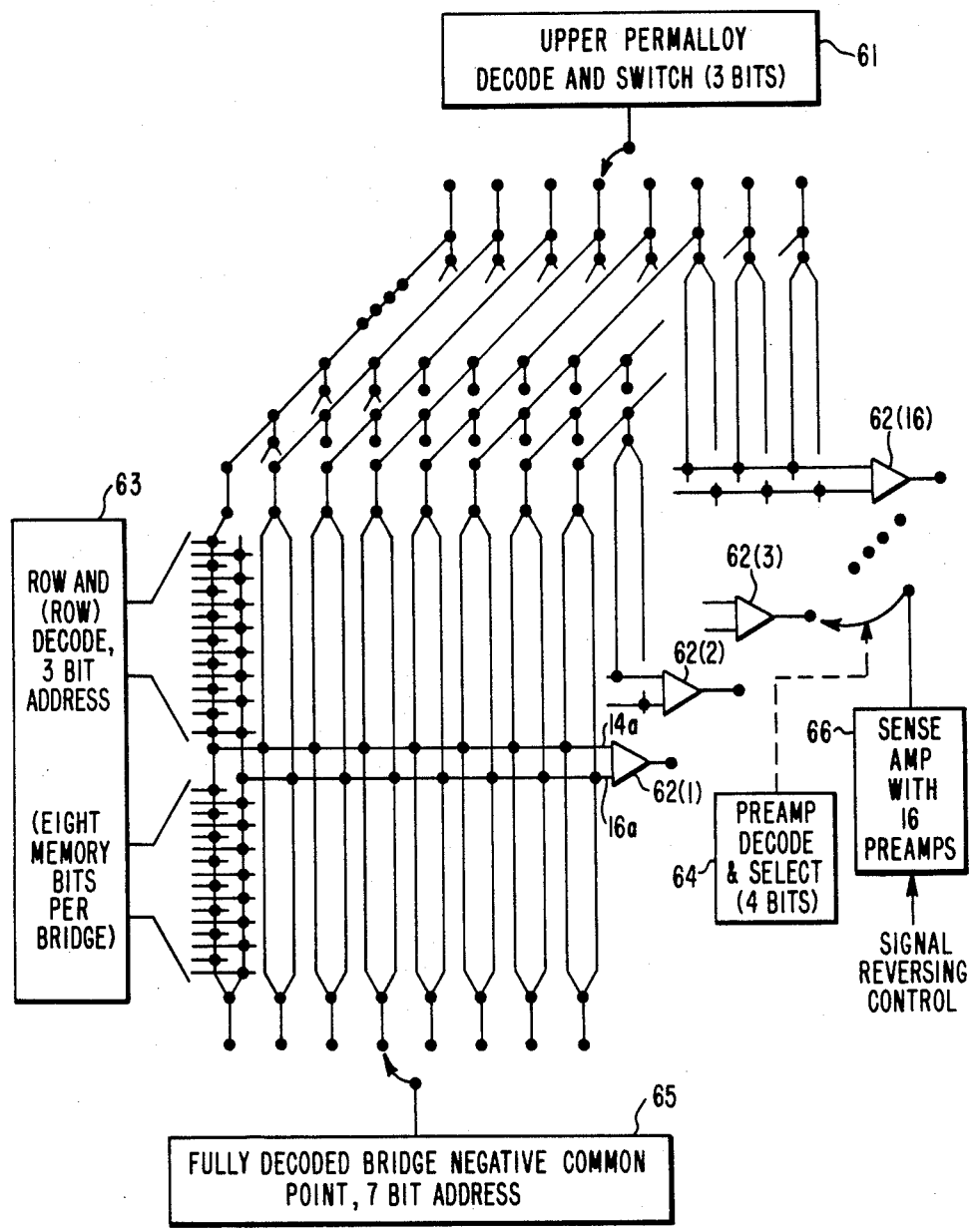
FIG. 7 is a schematic representation of a 1K cross-tie random access memory system embodiment of the present invention.

FIG. 7 is a schematic representation of a 1K or 1,024 bit magnetoresistive random access memory chip. In this schematic representation, the memory array comprises 8×16 bridges for a total of 128 bridges each with 8 memory elements aligned along the Permalloy columns of the bridges. Here again, a quad complementary cell is used to store a single digital bit. In FIG. 7, the signal output from the memory array is along one of 16 pairs of differential output lines such as 14a and 16b applied to one of 16 pre-amps 62(1) selected by pre-amp decode and select means 64 for connection to sense amplifier 66. Within each bridge or along a single Permalloy column, eight binary digits are stored via eight memory elements arranged in series in each leg of the bridge. The selection of one bit out of eight is achieved by the three-bit address of the appropriate row conductor pair. For the bridge column selection the unique coincidence scheme using a two-dimensional matrix selects a particular bridge column without any interaction between any other bridge. The 128 bridges are fully decoded at the negative common point of the bridge. The 16 groups of eight bridges eliminates the need to duplicate the same number of large high-current switches at the positive common point of the bridge. As seen in FIG. 7, only three bits of decoding and eight large current switches are needed for the bridge's positive common points. In this FIG. 7 embodiment the magneto-resistive column decode and switch means 61 is coupled to the upper ends of these bridge columns. The row and decode means 63 is coupled to the row conductors, and the lower end of the bridge columns are coupled to the decoded bridge means 65. Choosing one out of sixteen pre-amps 62(1)–62(16) completes the remaining four bits out of seven to fully select one bridge out of 128 for read-out. A signal reversing control signal is seen applied to the sense amplifier 66. This signal reversing control signal serves to permit current reversal through the memory elements during the read operation and eliminate the need to duplicate large current switches in the column address means for reading the memory elements. This signal reversing means is seen in greater detail in the circuit schematic of FIG. 9.

Figure 9:
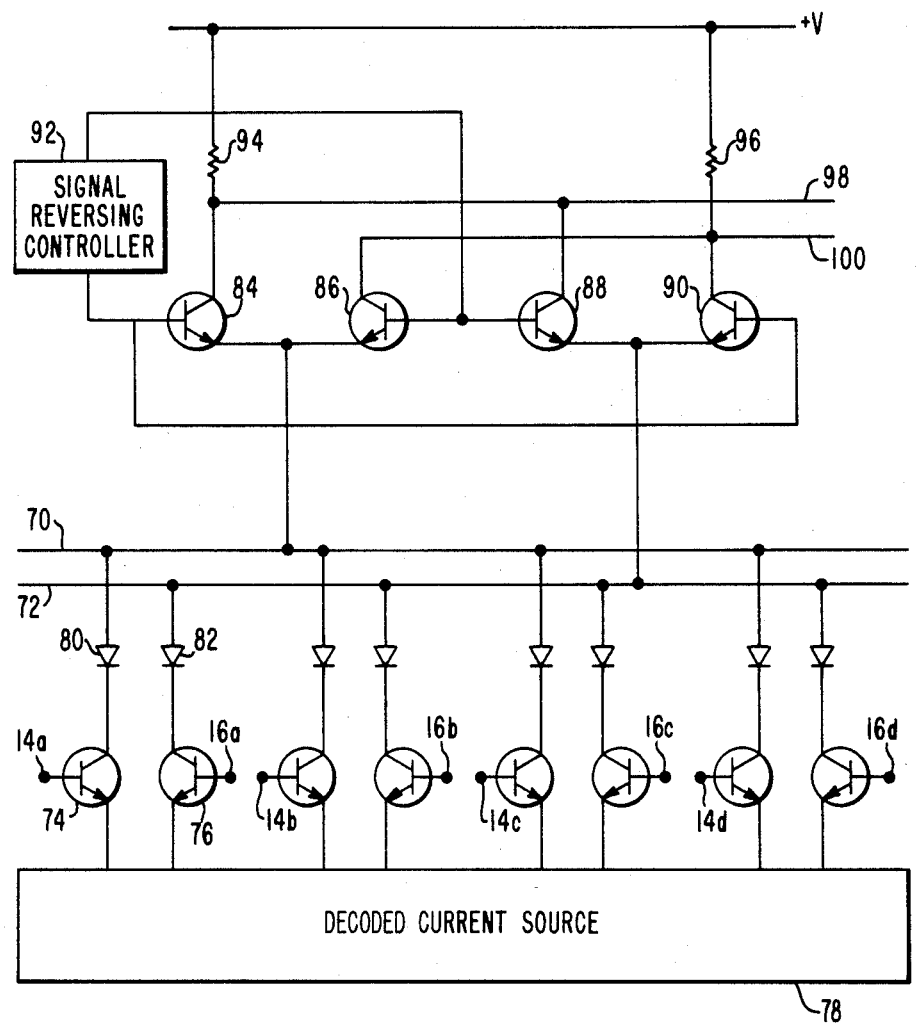
FIG. 9 is circuit schematic illustrating the signal reversing control and means for reversing the current in the differential pairs from the selected memory bridge.

In FIG. 9 the output of one of the sixteen preamps, such as 62(1) is applied to lines 70 and 72. Lines 70 and 72 are respectively connected to here four of the sixteen preamps, with the differential preamp input lines 14a, 16a for the preamp 62(1) connected respectively to the base of transistors 74 and 76. The emitters of these transistors 74 and 76 are connected to decoded current source 78 with the collectors of transistors 74 and 76 connected respectively to diodes 80, 82 which are connected to lines 70 and 72. In like manner three other of the sixteen preamps are shown connected to lines 70 and 72. The diodes in the respective collector nodes in part provide for total isolation of the selected memory bridge from all others which are not selected for reading. Lines 70 and 72 are also connected respectively to steering transistor pairs 84, 86, and 88, 90 at the steering transistor emitters. The bases of transistors 84 and 90 are connected in common to one side of the signal reversing controller 92, while the bases of transistors 86 and 88 are connected in common to the other side of signal reversing controller 92. The collectors of transistors 84 and 88 are commonly connected to resistor 94 which is connected to potential +V, while the collectors of transistors 86 and 90 are commonly connected to resistor 96 which is also connected to potential +V.

The transistors 84, 86, 88 and 90 serve to steer the differential currents from the selected preamp into the matching load resistors 94 and 96. A current mode logic signal of one sense applied to these transistors can be associated with input 14a being non-inverting. The opposite current mode logic signal clearly reverses the current of the differential pair into the other load resistor, thereby associating input node 14a with the signal inverting input. Furthermore, the signal reversing control with the most positive bias functions as a pseudo power supply/bias source causing the transistors which it activates to behave like grounded base cascade stages thereby speeding the settling of the circuit. The reversible signal out is fed on lines 98, 100. Since the column write buses are not interconnected via the sensing preamps as are the bridges, choosing one writing column out of 128 simply involves three bits of address at the positive supply and four bits at the negative supply, with a tremendous saving in the number of large high-current switching transistors. The sense amplification means 66 includes the double-correlated double-sampling signal processing system as used in the embodiment of FIG. 1.

Figure 8:
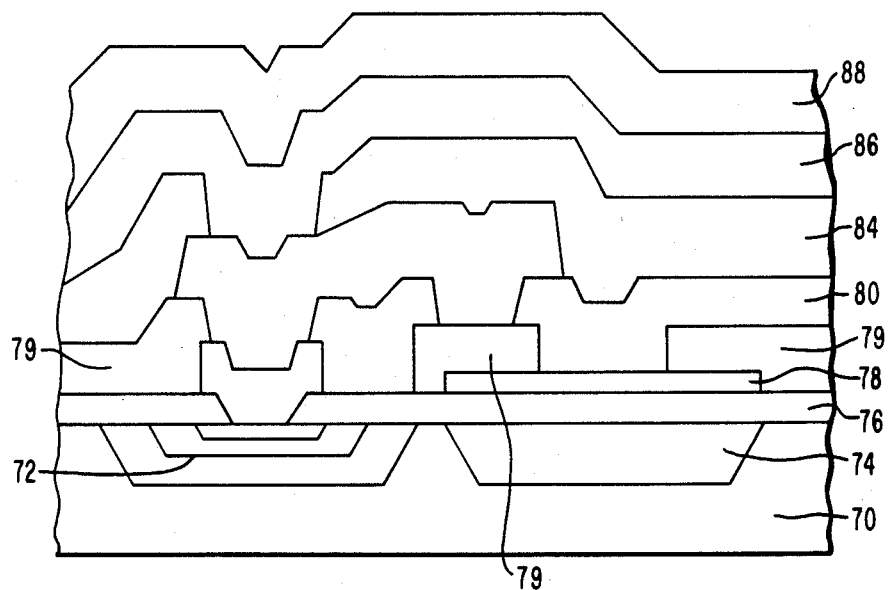
FIG. 8 is an illustrative cross-section representation illustrating how the cross-tie random access memory array system of the present invention can be integrated in a monolithic design upon a substrate and integrated with switching transistors.

FIG. 8 is a cross-sectional representation of how the 1K cross-tie random access memory can be implemented in a monolithic fashion upon a semi-conductive substrate 70 with a transistor 72 and a semiconductive tub 74 provided beneath the first dielectric layer 76 and the thin magnetoresistive film 78. A low resistance contact layer 79 is disposed over dielectric 76 and magnetoresistive layer 78 to make electrical contact to the layer 78, as well as functioning as an etch stop, and a low resistance magnetoresistive layer interconnect/shunt, and a transistor contact layer. A first dielectric layer 80 is disposed atop the magnetoresistive layer 78. A row conductor 82 is seen disposed in part over dielectric layer 80 and aligned over in part the magnetoresistive film 78. A second dielectric layer 84 is disposed atop the row conductor 82 and a column conductor 86 is disposed atop the second dielectric layer 84. A scratch protection dielectric 88 is disposed over the entire chip area except for the bonding pad region.

We claim:

1. A magnetoresistive random access cross-tie memory array comprising:
   (a) an insulating subtrate;
   (b) a plurality of spaced columns of thin film magnetoresistive material disposed upon said substrate, which thin film columns are symmetrically patterned and shaped to provide only two stable magnetic domain states at spaced memory elements which form an X-Y array of spaced apart memory elements which are magnetically addressable to one of two possible stable states, and wherein a single binary digital bit is written and stored at four memory elements which are defined on four spaced adjacent columns of magnetoresistive material, with one memory element of the four being located along each of the four columns of magnetoresistive material;
   (c) row conductors aligned over row aligned pairs of memory elements, with two of the four memory elements aligned under a first row conductor, and the other two memory elements are aligned under a second row conductor;

(d) serpentine shaped column conductors having columnar extending portions interconnecting row aligned extending portions arranged so that adjacent row extending portions conduct current in opposed directions over row adjacent memory elements whereby a single binary digit can be stored in complementary fashion in a pair of adjacent memory elements, and wherein all four memory elements for a single binary digital bit are aligned under a single serpentine column conductor, with the two memory elements aligned under the first row conductor aligned under a first row conductor aligned portion of the serpentine column conductor, and the other two memory elements aligned under the second row conductor are aligned under a second row conductor aligned portion of the serpentine column, with the signals in the first and second row conductor aligned portions of the serpentine columns being complementary signals.

2. The magnetoresistive random access cross-tie memory array system set forth in claim 1, wherein the single binary digit is written and stored at the four memory elements by applying a half address signal to the serpentine column, while simultaneously applying complementary half address signals to the first and second row conductors.

3. The magnetoresistive random access cross-tie memory array system set forth in claim 1, wherein the single binary digit is read out by applying a read signal to the selected column of magnetoresistive material while applying a half address read signal to the selected row conductor to affect a change of resistance at the selected memory element as a function of the applied magnetic field, which magnetoresistive effect is detectable to identify one of two stable magnetic domain states which represent the binary data.

4. A magnetoresistive random access cross-tie memory array system comprising:

(a) a plurality of spaced columns of thin film of magnetoresistive material disposed upon a substrate and shaped to exhibit only two stable magnetic domain states, which thin film columns are symmetrically patterned to provide an X-Y array of spaced apart memory elements which are magnetically addressable to one of two possible stable states and wherein a single binary digital bit is written and stored at four memory elements which are defined on four spaced adjacent columns of magnetoresistive material, with one memory element of the four being located along each of the four columns of magnetoresistive material;

(b) row conductors aligned over row aligned pairs of memory elements with two of the four memory elements aligned under a first row conductor, and the other two memory elements are aligned under a second row conductor;

(c) serpentine shaped column conductors having columnar extending portions interconnecting row aligned extending portions arranged so that adjacent row aligned extending portions conduct current in opposed directions over row aligned adjacent memory elements, and wherein all four memory elements for a single binary digital bit are aligned under a single serpentine column conductor, with the two memory elements aligned under the first row conductor aligned under a first row conductor aligned portion of the serpentine column conductor, and the other two memory elements aligned under the second row conductor are aligned under a second row conductor aligned portion of the serpentine column, with the signals in the first and second row conductor aligned portions of the serpentine columns being complementary signals;

(d) digital signal writing means connectable to the row and column conductors whereby a single binary digit can be stored in complementary fashion in (a pair of adjacent) the four (cells) elements;

(e) means connectable to the thin film columns when the stored binary data is to read out of memory;

(f) digital sequential read signal means connectable to the row conductors, which read signal produces a magnetoresistive response in the memory elements which response is indicative of the respective stable states written into the memory elements;

(g) memory array read-out signal processor means for differentially processing the magnetoresistive response induced voltage increment from the complementary memory cells.

* * * * *